(12) United States Patent
Minagawa (10) Patent No.: US 11,575,371 B2
(45) Date of Patent: Feb. 7, 2023

(54) SEMICONDUCTOR DEVICE

(71) Applicant: FUJI ELECTRIC CO., LTD., Kawasaki (JP)

(72) Inventor: Kei Minagawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/386,766

(22) Filed: Jul. 28, 2021

(65) Prior Publication Data
US 2022/0069815 A1  Mar. 3, 2022

(30) Foreign Application Priority Data
Aug. 25, 2020 (JP) .............................. JP2020-141295

(51) Int. Cl.
| | | |
|---|---|---|
| G01R 19/165 | (2006.01) | |
| H03K 17/082 | (2006.01) | |
| G08B 21/18 | (2006.01) | |
| H03K 17/08 | (2006.01) | |

(52) U.S. Cl.
CPC ... *H03K 17/0828* (2013.01); *G01R 19/16566* (2013.01); *G08B 21/185* (2013.01); *H03K 2017/0806* (2013.01)

(58) Field of Classification Search
CPC ....... H03K 17/08116; H03K 17/08128; H03K 17/08148; H03K 17/0828; H03K 17/107; H03K 17/127; G01R 19/16566; G01R 19/16571; G01R 19/16576; G01R 19/1659; G01R 19/16595; G08B 21/18; G08B 21/182; G08B 21/185
See application file for complete search history.

(56) References Cited

U.S. PATENT DOCUMENTS

| | | | |
|---|---|---|---|
| 11,095,283 B2* | 8/2021 | Inoue | ................. H03K 17/0828 |
| 2013/0147407 A1 | 6/2013 | Kawamura | |
| 2021/0296881 A1* | 9/2021 | Minagawa | .............. H01L 23/34 |

FOREIGN PATENT DOCUMENTS

| | | |
|---|---|---|
| JP | 2000134074 A | 5/2000 |
| JP | 201275234 A | 4/2012 |

* cited by examiner

*Primary Examiner* — Long Nguyen (57) ABSTRACT

A semiconductor device including a plurality of power modules each of which includes a power semiconductor switching element that has a temperature detection diode, and a drive circuit that has an output circuit for switching on and off the power semiconductor switching element, and that outputs a warning signal for calling attention if the value of the forward voltage of the temperature detection diode becomes equal to or smaller than a first reference voltage value, and that outputs a protection operation signal for stopping the on/off operation of the power semiconductor switching element if the value of the forward voltage becomes equal to or smaller than a second reference voltage value smaller than the first reference voltage value. The semiconductor device outputs the logical sum of the warning signals of the individual power modules as an external warning signal.

7 Claims, 6 Drawing Sheets

SEMICONDUCTOR DEVICE

CROSS-REFERENCE TO RELATED APPLICATIONS

The present application claims priority from Japanese Patent Application No. 2020-141295, filed Aug. 25, 2020, the entire content of which is incorporated herein by reference.

TECHNICAL FIELD

The present invention relates to a semiconductor device which is configured to include a plurality of power modules consisting of power semiconductor switching elements such as IGBTs and drive circuits for driving them, and more particularly, to a semiconductor device having a temperature detection function and an overheat protection function for power semiconductor switching elements.

BACKGROUND ART

In general, devices which operate using power semiconductor switching elements such as IGBTs have an overheat protection function. This function is a function of detecting the temperature of a power semiconductor switching element and performing a protection operation such as outputting an alarm or stopping the operation of the device when the temperature exceeds a predetermined temperature.

In the related art, technologies for collectively detecting the temperatures of a plurality of power semiconductor switching elements have been proposed. For example, a semiconductor module including a three-phase bridge circuit, disclosed in JP2000-134074A, amplifies voltages output from temperature detection diodes provided on individual semiconductor elements (IGBT) by analog isolated amplifiers and uses the amplified voltages as temperature information items. Further, the semiconductor module selects the temperature information item of an element having the highest temperature from the temperature information items of the individual semiconductor elements, and performs a protection operation when the corresponding temperature information item is equal to or higher than a threshold.

However, since the output voltages of the temperature detection diodes and the temperatures vary, it is not always true that the method of comparing values obtained by amplifying the output voltages of temperature detection diodes as disclosed in JP2000-134074A can precisely select an IGBT having the highest temperature. Further, there is a possibility that a deviation may occur between the actual temperature of the selected IGBT and a temperature estimated on the basis of the output voltage value of the temperature detection diode.

SUMMARY

The present invention was made to deal with the circumstances of the related art, and an object of the present invention is to provide a semiconductor device which is configured using a plurality of power semiconductor switching elements and can accurately detect the temperatures of the individual power semiconductor switching elements and efficiently collects them.

In order to achieve the above-mentioned object, a semiconductor device of the present invention including a plurality of power modules each of which includes a power semiconductor switching element that has a temperature detection diode, and a drive circuit that has an output circuit for switching on and off the power semiconductor switching element, and that is configured to output a warning signal for calling attention if the value of the forward voltage of the temperature detection diode becomes equal to or smaller than a first reference voltage value, and that is configured to output a protection operation signal for stopping the on/off operation of the power semiconductor switching element if the value of the forward voltage becomes equal to or smaller than a second reference voltage value smaller than the first reference voltage value. The semiconductor device is configured to output the logical sum of the warning signals of the individual power modules as an external warning signal.

In the present invention, with respect to each of the power semiconductor switching elements, whether the forward voltage of the temperature detection diode mounted on the corresponding element exceeds a predetermined threshold voltage is determined, and the logical sum of the determination results are output to the outside.

Preferably, at least one of the first reference voltage value and the second reference voltage value may be configured to be adjustable. In this case, first, the temperature of each of the power modules is accurately detected, and the logical sum of the detection results is output. Therefore, it is possible to efficiently output a warning signal based on accurate temperature detection to the outside.

Also, it is preferable that each of the power modules should have a switching unit for permitting or prohibiting output of the warning signal. In this case, it is possible to efficiently perform adjustment of the reference voltages for determining whether to output a warning signal or a protection operation signal.

Also, the drive circuit of the semiconductor device according to the present invention further includes:
a first comparator that is configured to compare the forward voltage and the first reference voltage, and that is configured to output the warning signal; and
a second comparator that is configured to compare the forward voltage and the second reference voltage, and is configured to output the protection operation signal. The first comparator and the second comparator are hysteresis comparators.

As the comparators, hysteresis comparators are used. Therefore, it is possible to implement a stable operation without repeating overheat protection occurrence/restoration attributable to a warning or protection operation signal.

By the way, in the case where the semiconductor device is a single-phase inverter, it is preferable to aggregate the warning signals of a power module for an upper arm and a power module for a lower arm and output the result to the outside. Also, in the case where the semiconductor device is a three-phase inverter, it is preferable to aggregate warning signals of individual phases, and output the result to the outside.

As described above, according to the present invention, it is possible to accurately detect the temperatures of the individual semiconductor switching elements, and the semiconductor device can efficiently collect the temperature information.

DESCRIPTION OF EMBODIMENTS

Hereinafter, a first embodiment of a semiconductor device according to the present invention will be described with reference to the drawings.

Figure 1:
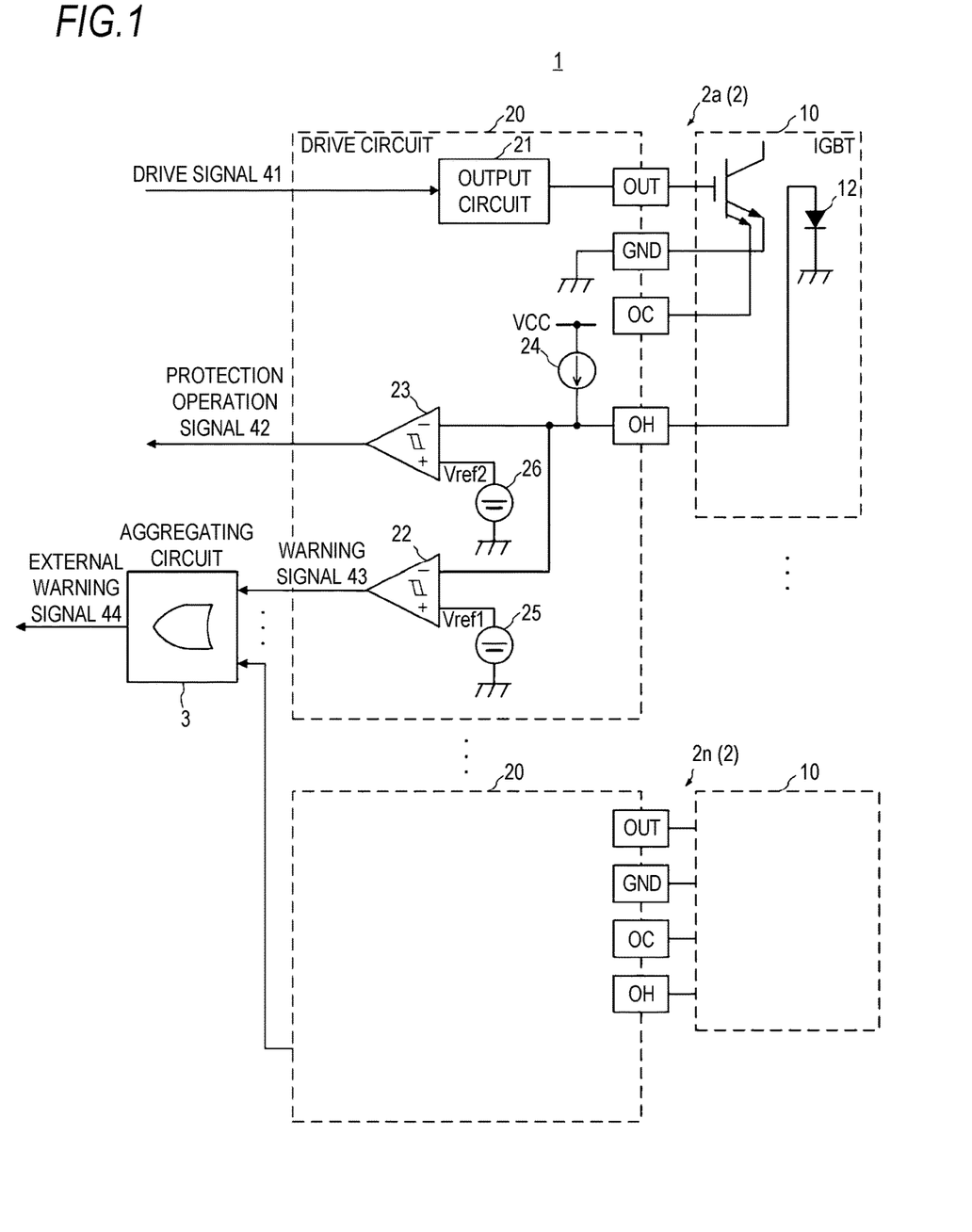
FIG. 1 is a configuration diagram of a semiconductor device according to a first embodiment of the present invention.

FIG. 1 is a configuration diagram of a semiconductor device 1 according to the present embodiment. As shown in FIG. 1, the semiconductor device 1 is composed of a plurality of power modules 2 (2a to 2n). Each of the power modules 2 (2a to 2n) is composed of a power semiconductor switching element 10 such as an IGBT and a drive circuit 20. The power semiconductor switching element 10 is not limited to an IGBT, and may be a MOSFET or the like, and hereinafter, an IGBT will be described as an example. In the present embodiment, the IGBT 10 has a temperature detection diode 12 inside the chip.

The drive circuit 20 has an output circuit 21 for applying a voltage to the gate terminal of the IGBT 10 on the basis of an input drive signal 41 to turn on or off the IGBT 10. The drive circuit 20 also has a constant-current source 24. And the drive circuit applies a constant current from the constant-current source 24 to the temperature detection diode 12 of the IGBT 10, and detects the forward voltage (hereinafter, referred to as the "detection voltage"). The detection voltage is input to the inverting input terminals of a comparator 22 and a comparator 23. The non-inverting input terminal of the comparator 22 is connected to a reference voltage source 25 for outputting a voltage having a reference voltage value Vref1, and the non-inverting input terminal of the comparator 23 is connected to a reference voltage source 26 for outputting a voltage having a reference voltage value Vref2. By the way, as the reference voltage value Vref2, a value smaller than the reference voltage value Vref1 is set. It is preferable to use hysteresis comparators as the comparators 22 and 23.

The output terminals of the comparators 22 of the drive circuits 20 of the plurality of power modules 2 (2a to 2n) are connected to the input terminals of an aggregating circuit 3 composed of an OR circuit. From the output terminal of the aggregating circuit 3, an external warning signal 44 is output as the result of the OR operation of warning signals 43 for calling attention to the temperatures of the individual IGBTs 10.

From the output terminal of the comparator 23 of each drive circuit 20, a protection operation signal 42 is output. This protection operation signal 42 is input to an external circuit such as a PWM circuit (not shown in the drawings). If the protection operation signal 42 is input, the external circuit performs a predetermined protection operation such as reducing the switching frequency or stopping the operation. By the way, as an example of a simple protection method, there is a method of inputting a protection operation signal 42 to the output circuit 21 of the drive circuit 20 having output the corresponding protection operation signal 42 and forcibly switching off the output of the output circuit, regardless of the drive signal 41, if the protection operation signal 42 is on (the enable state). In this case, it is possible to realize an overheat protection function with a simple configuration.

The forward voltage of each temperature detection diode 12 is dependent on temperature, and as the temperature rises, the value of the forward voltage decreases. Therefore, if the value of the detection voltage becomes equal to or smaller than the reference voltage value Vref1, the output of the comparator 22 transitions to the ON state (high level), and the warning signal 43 transitions to the ON state (the enable state). Therefore, it is notified to the outside that the chip temperature of the IGBT 10 is approaching the abnormal level.

Figure 2A:
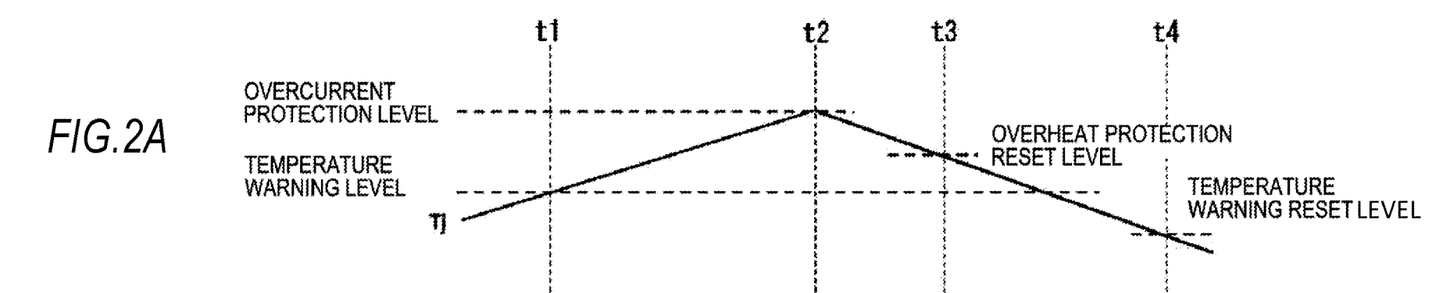
FIGS. 2A to 2D are timing charts for explaining the operation of FIG. 1.
Figure 2B:
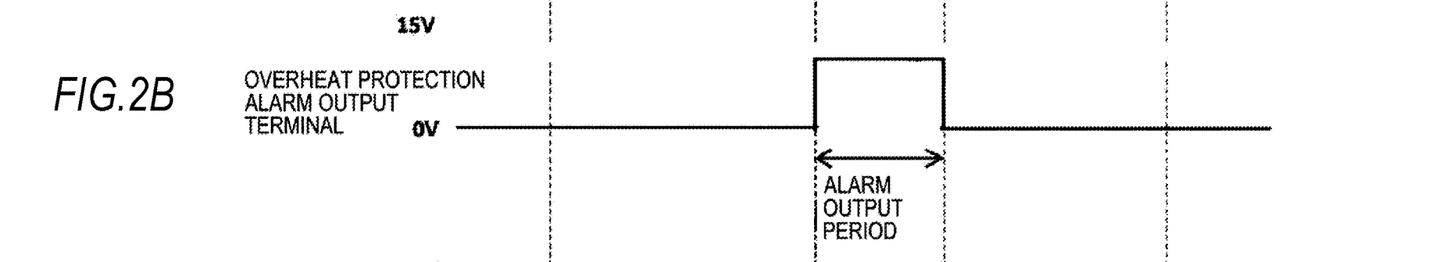
Figure 2C:
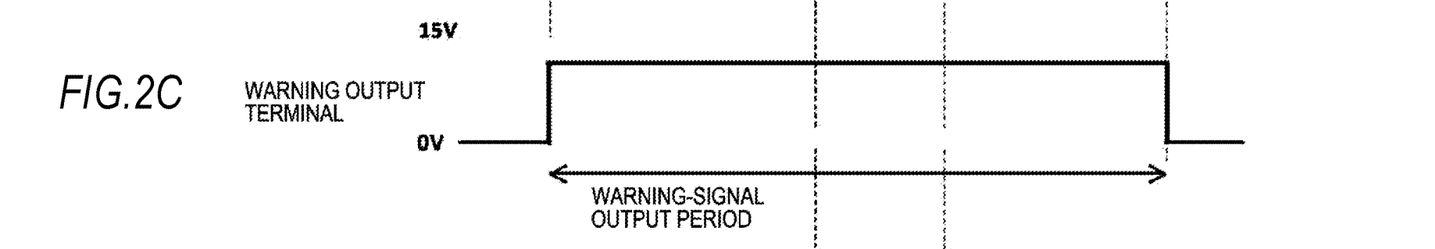
Figure 2D:
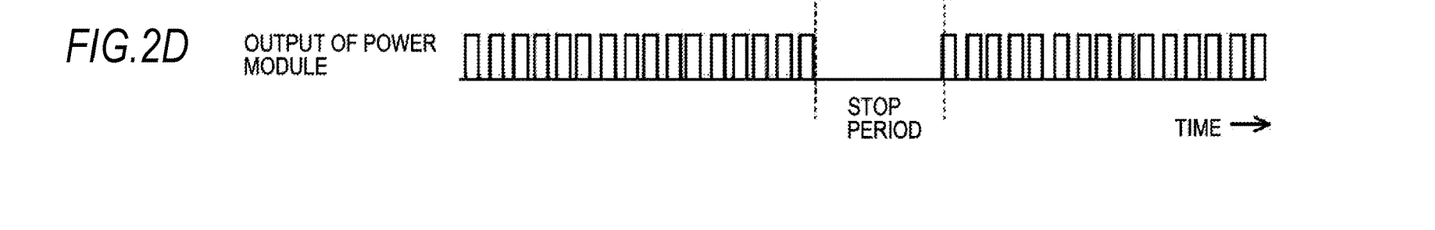

The action of a power module having the above-described configuration when the temperature is abnormal will be described using FIGS. 2A to 2D. In the graphs shown in FIGS. 2A to 2D, the horizontal direction is a time axis. In the vertical direction, FIG. 2A shows temperature change and the operation timings of the comparators 22 and 23, and FIG. 2B shows the waveform of the output timing of the protection operation signal (alarm) 42, and FIG. 2C shows the waveform of the warning signal 43, and FIG. 2D shows the output pulse waveform from the OUT terminal of the drive circuit 20 of the power module.

In the semiconductor device 1 having the above-described configuration, when the temperatures of all of the IGBTs 10 are equal to or smaller than a predetermined value and all of the power modules 2 (2a to 2n) operate normally, since the values of the forward voltages (detection voltages) of the temperature detection diodes 12 are larger than the reference voltage value Vref1, the warning signal 43 is not output from any power modules 2 (2a to 2n). As a result, the external warning signal 44 which is the output of the aggregating circuit 3 becomes the OFF state (the disable state).

Then, if the temperature of the IGBT 10 of a certain power module 2 gradually rises and exceeds a temperature warning level at a time point t1, i.e. the detection voltage of the temperature detection diode 12 becomes equal to or smaller than the reference voltage value Vref1, the output of the comparator 22 becomes the ON state, and the output (the warning output terminal) of the aggregating circuit 3 becomes the High level. Thereafter, if the temperature of the IGBT 10 continues to rise and exceeds an overcurrent protection detection level at a time point t2, i.e. the detection voltage of the temperature detection diode 12 becomes equal to or smaller than the reference voltage value Vref2, the output of the comparator 23 becomes the ON state, and the protection operation signal 42 becomes the enable state. The external circuit (not shown in the drawings) detects that the protection operation signal 42 has become the enable state, and performs the protection operation. In the example of FIG. 2D, in a protection operation period, the external circuit interrupts the gate current of the IGBT 10 to stop the operation. As a result, the temperature of the corresponding IGBT 10 starts to drop. Then, if the detection voltage value becomes larger than the reference voltage value Vref2 by the hysteresis at a time point t3, the output of the comparator 23 becomes the OFF state, whereby the protection operation signal 42 is reset. As a result, the external circuit (not shown in the drawings) restarts the operation, and voltage pulses are supplied to the gate terminal of the IGBT 10 again, whereby on/off switching is restarted. Thereafter, if the temperature further drops, and the detection voltage value becomes larger than the reference voltage value Vref1 by the hysteresis at a time point t4, the output of the comparator 22 becomes the OFF state, whereby the warning signal 43 is reset.

As described above, according to the present embodiment, the power modules 2 (2a to 2n) output protection operation signals for overheat protection, and warning signals for alerting the outside are aggregated into one by the aggregating circuit, and the aggregated signal is output. As a result, it is possible to surely perform the protection operation on power modules having overheat abnormality, and simplify processing by aggregating warning signals. Therefore, it becomes possible for the semiconductor device to efficiently collect temperature information.

Other Examples

Figure 3:
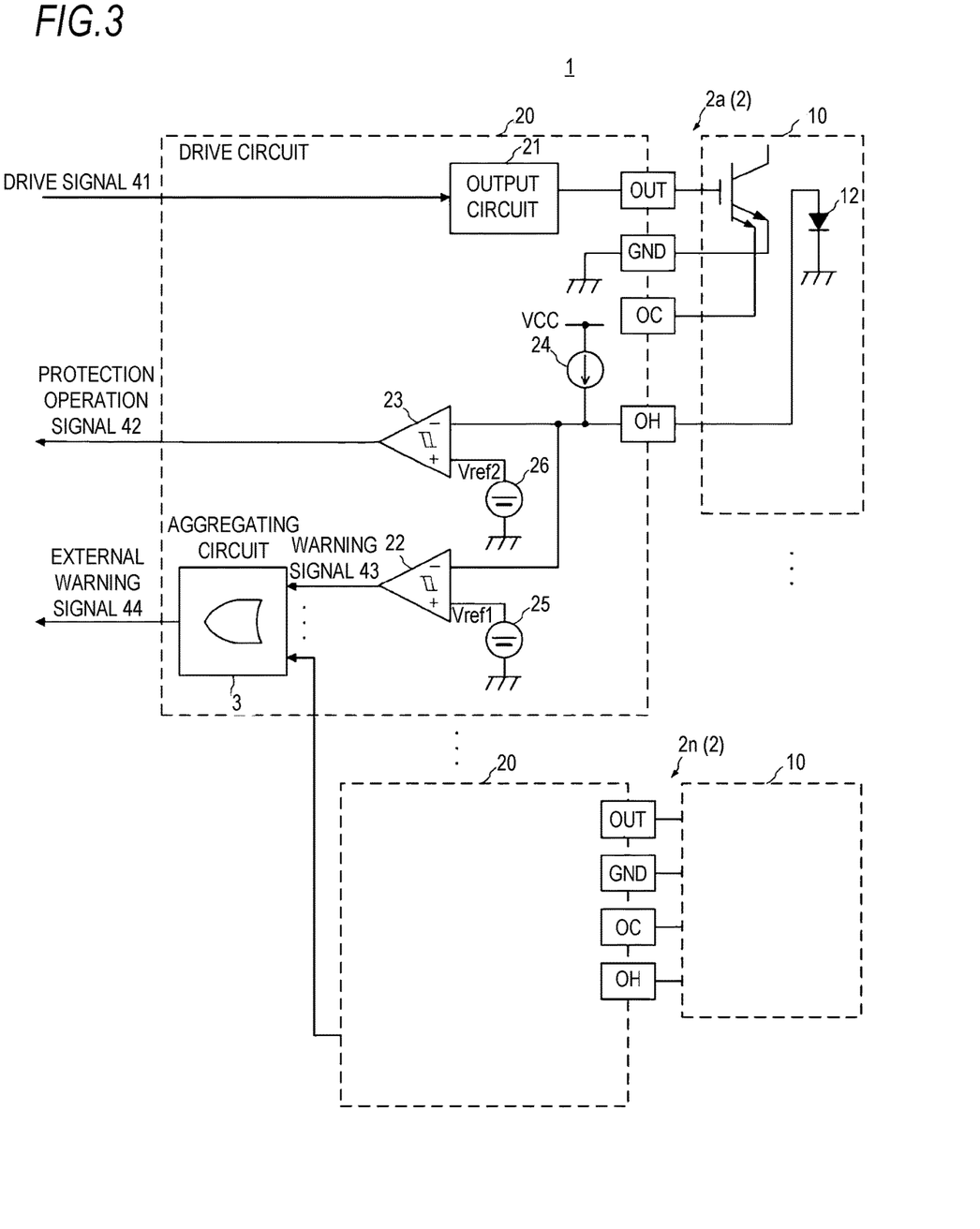
FIG. 3 illustrates another example of FIG. 1.

In FIG. 1, the aggregating circuit 3 is provided as the destination of the warning signals 43 which are output from the individual power modules 2 (2a to 2n). This aggregating circuit 3 can be provided on a substrate different from that for the power modules 2 (2a to 2n), and be mounted in the semiconductor device 1. In contrast with this, the aggregating circuit 3 may be provided in any one power module of the power modules 2 (2a to 2n) as shown in FIG. 3.

(Applications)

Now, applications of the present invention will be described. What unit the warning signals should be aggregated in is important, and in the case of a semiconductor device 1 including an single-phase inverter circuit, it can pair a power module (e.g., power module 2a) constituting an upper arm and a power module (e.g., power module 2n) constituting a lower arm, and calculate the logical sum of the warning signals 43 of the individual power modules by the aggregating circuit 3, and output the result as the external warning signal 44 (see, e.g., FIG. 1).

In the case where the semiconductor device 1 includes a three-phase inverter circuit, it can compute the logical sum of the warning signals of power modules (2a to 2n) constructing the individual phases by the aggregating circuit 3, and output the result as the external warning signal 44.

Now, a second embodiment of the present invention will be described.

Figure 4:
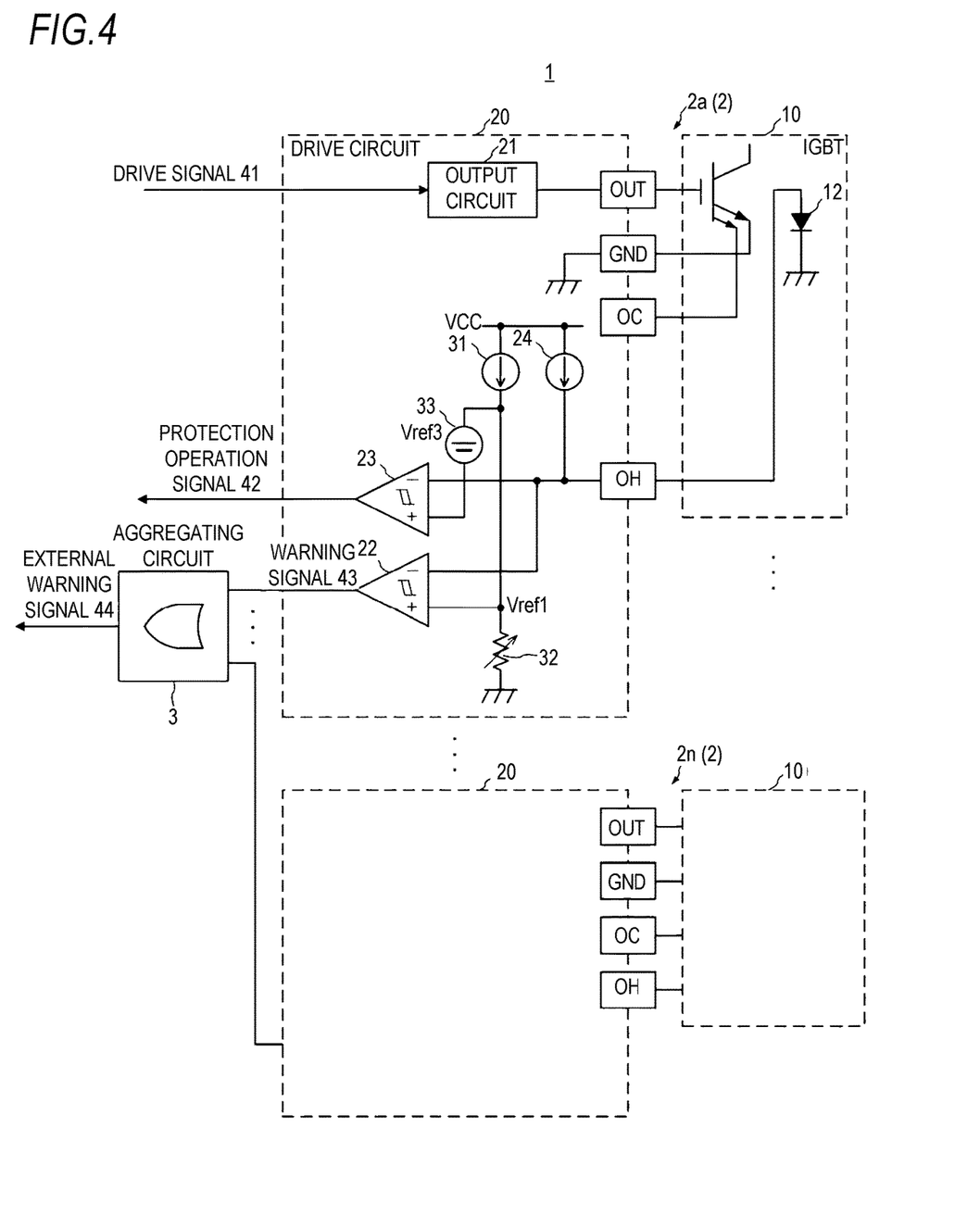
FIG. 4 is a configuration diagram of a semiconductor device according to a second embodiment of the present invention.

In the present embodiment, it is assumed that the reference voltage value Vref1 can be variably set from the outside. FIG. 4 is a configuration diagram of a semiconductor device 1 according to the present embodiment. A main difference in the configuration from FIG. 1 is that the output terminal of a constant-current source 31 is connected to one end of a variable resistor 32 and the non-inverting input terminal of the comparator 22, and the other end of the variable resistor 32 is connected to the reference potential (GND). Further, the output of the constant-current source 31 is connected to the positive side of a reference voltage source 33, and the negative side of the reference voltage source 33 is connected to the non-inverting input terminal of the comparator 23. The voltage between both ends of the reference voltage source 33 is a reference voltage value Vref3. The other configuration is the same as that of FIG. 1, so identical elements are denoted by the same reference symbols, and a description thereof will not be made.

In the semiconductor device 1 having the above-described configuration, to the inverting input terminals of the comparators 22 and 23, the forward voltage (detection voltage) of the temperature detection diode 12 included in the IGBT 10 is applied. Meanwhile, from the constant-current source 31 to the variable resistor 32, a constant current flows, and the voltage generated between both ends of the variable resistor is applied to the non-inverting input terminal of the comparator 22. This reference voltage value Vref1 serves as a reference voltage value for the comparator 22 to determine whether to output a warning signal on the basis of the detection voltage of the temperature detection diode 12. Meanwhile, to the non-inverting input terminal of the comparator 23, a reference voltage value (Vref1−Vref3) is applied. This reference voltage value (Vref1−Vref3) serves as a reference voltage value for the power module 2 to determine whether to output the protection operation signal 42.

In the semiconductor device 1 according to the present embodiment, it is possible to adjust the reference voltage value Vref1 at which the comparator 22 activates the warning signal 43. In general, the forward voltage value when the constant current flows in the temperature detection diode 12 and the temperature of the IGBT vary. Further, the detection voltages may differ depending on the individual phases. Therefore, when the semiconductor device 1 is tested, the IGBT 10 is turned on such that a collector current flows, and on the basis of the detection voltage value when the IGBT 10 reaches a predetermined temperature, the variable resistor 32 is adjusted such that the detection voltage value at the temperature for outputting the warning signal becomes the reference voltage value Vref1.

In the semiconductor device 1 having the reference voltage value adjusted in the above-mentioned way, if the detection voltage value of the IGBT 10 of a certain power module 2 becomes the reference voltage value Vref1, the warning signal 43 of the corresponding power module is output. Then, if the detection voltage value further decreases by Vref3 since the output of the warning-signal, the protection operation signal 42 is output.

In the present embodiment, since the each power module 2 is configured such that the reference voltage value Vref1 is adjustable, in addition to the effects of the first embodiment, an effect that it is possible to reduce variations in the forward voltage values and the temperatures of the IGBTs when the constant currents flow in the temperature detection diodes 12 and accurately detect the temperatures of the IGBTs is achieved.

In addition, it goes without saying that even in the present embodiment, it is possible to implement the aggregating circuit 3 in a certain power module as shown in FIG. 3.

Now, a third embodiment of the present invention will be described.

Figure 5:
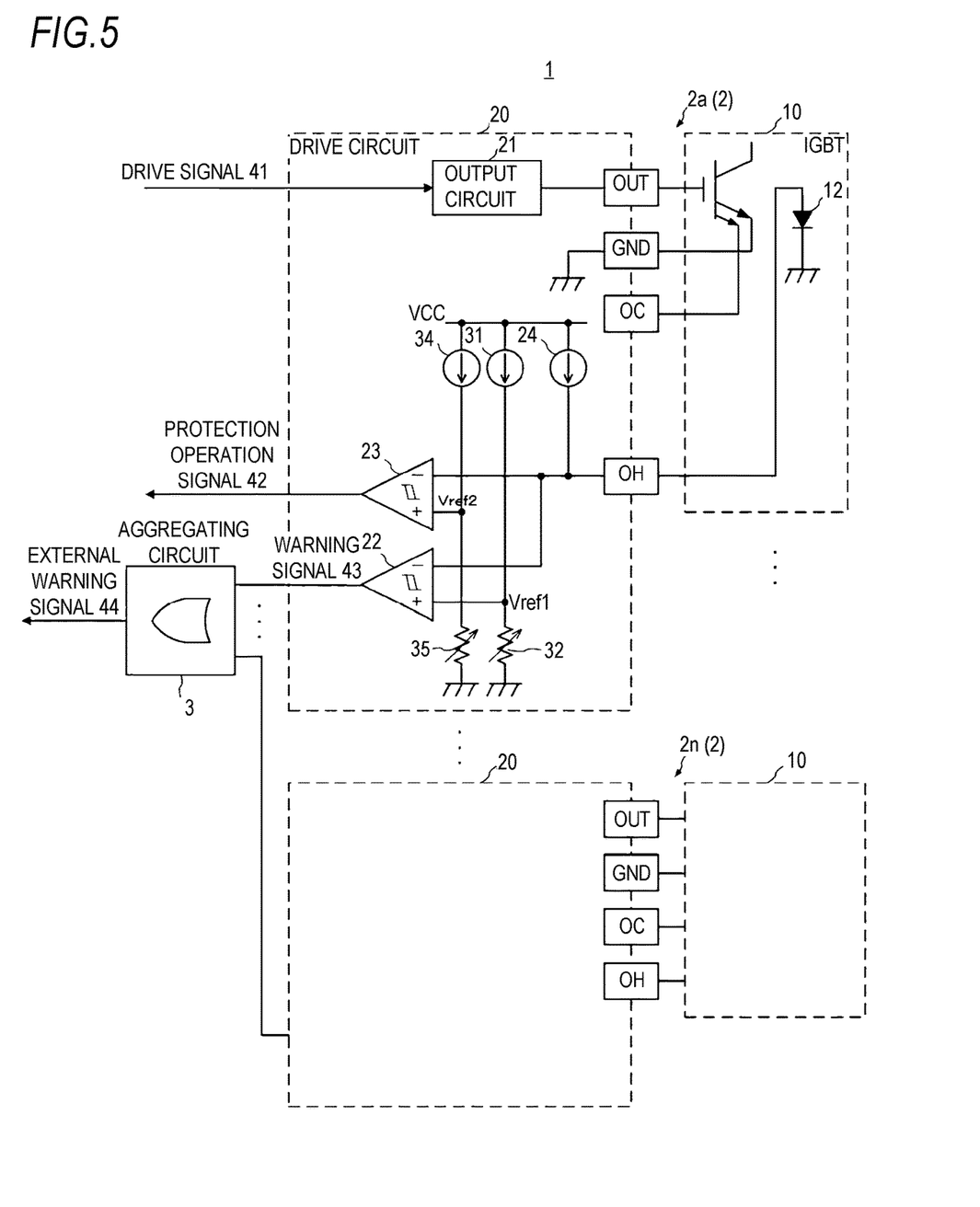
FIG. 5 is a configuration diagram of a semiconductor device according to a third embodiment of the present invention.

A feature of the present embodiment is that not only the reference voltage value Vref1 to serve as a reference for determining whether to output the warning signal, but also the reference voltage value Vref2 to serve as a reference for determining whether to output the protection operation signal 42 is adjustable. FIG. 5 is a configuration diagram of a semiconductor device 1 according to the present embodiment. A main difference from FIG. 4 is that a constant-current source 34 and a variable resistor 35 are newly provided, and the output of the constant-current source 34 is connected to one end of the variable resistor 35 and the non-inverting input terminal of the comparator 23, and the other end of the variable resistor 35 is connected to the reference potential (GND). The other configuration is the same as that of FIG. 4, so identical elements are denoted by the same reference symbols, and a description thereof will not be made.

According to the present embodiment, it is possible to independently adjust not only the reference voltage value Vref1 to serve as a reference for determining whether to output a warning signal 43, but also the reference voltage value Vref2 to serve as a reference for a power module 2 to determine whether to output the protection operation signal 42.

According to the present embodiment, in addition to the effects of the first and second embodiments, it is possible to accurately detect the temperature even when the protection operation signal is output.

Now, a fourth embodiment of the present invention will be described.

Figure 6:
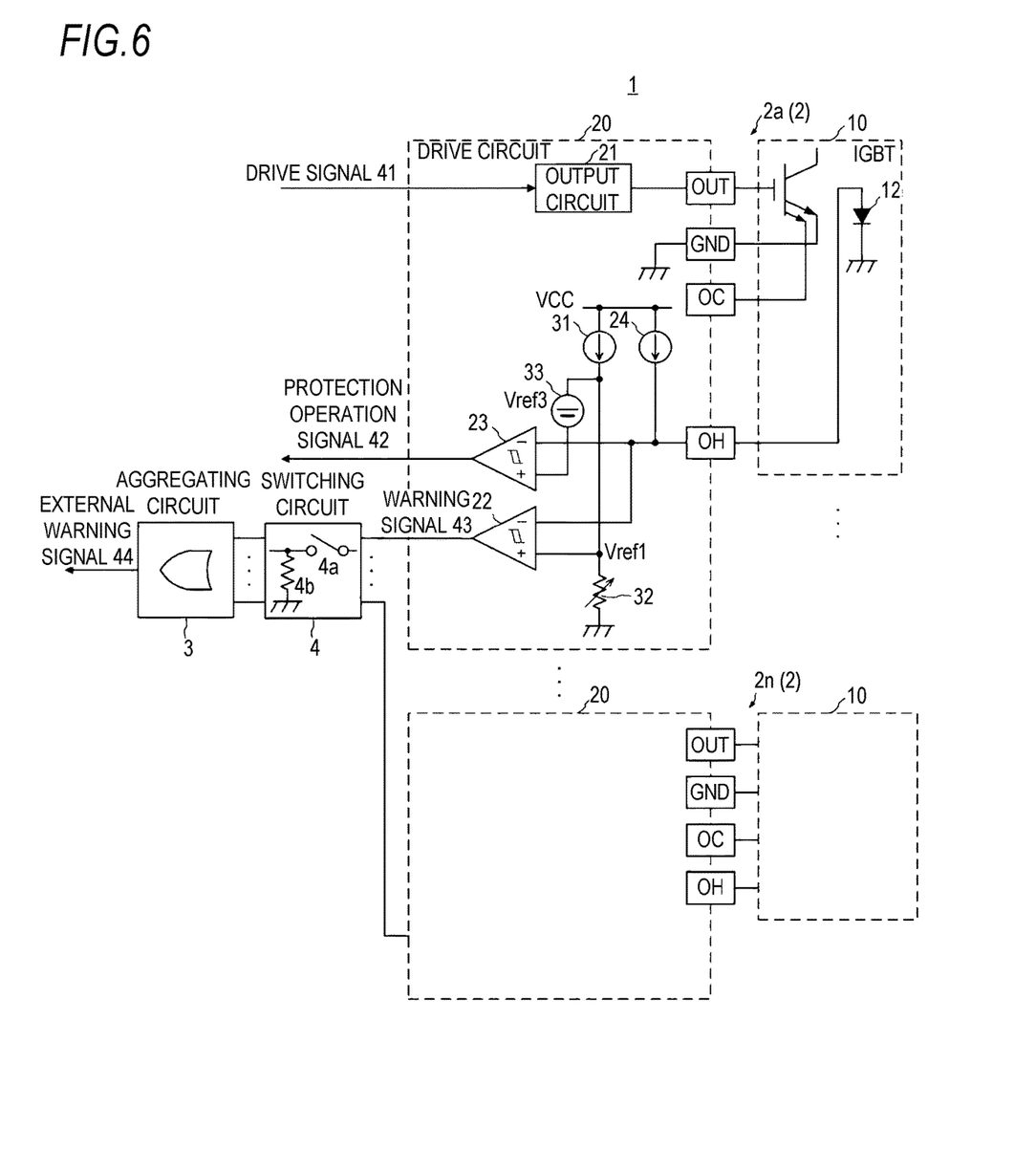
FIG. 6 is a configuration diagram of a semiconductor device according to a fourth embodiment of the present invention.

A feature of the present embodiment is that, as shown in FIG. 6, between each power module and the aggregating circuit 3, a switching circuit 4 for determining whether to permit the warning signal 43 output from the power module to pass is provided.

This switching circuit 4 includes a switch 4a for manually permitting or prohibiting passage of the warning signal 43, and a pull-down resistor 4b provided on the input side of the aggregating circuit (OR circuit) 3. The other configuration is the same as that of FIG. 4, so identical elements are denoted by the same reference symbols, and a description thereof will not be made.

In the semiconductor device 1 according to the present embodiment, when the reference voltage value Vref1 is adjusted by the variable resistor 32, in the switching circuit 4, only the switch for the power module which is the adjustment target is turned on and the other switches are turned off. As a result, the external warning signal 44 to be output from the aggregating circuit 3 is determined only based on the warning signal of the power module which is the adjustment target. Therefore, adjustment becomes easy. Further, in a state where all of the IGBTs are collectively set to a predetermined temperature, since it is possible to adjust each variable resistor 32, it is possible to improve the adjustment efficiency. After the adjustment of the variable resistors 32, all of the switches 4a of the switching circuits 4 are turned on, such that in the operation state, the warning signals 43 of the individual power modules are input to the aggregating circuit 3.

By the way, the switching circuits 4 may be provided in the configuration in which the aggregating circuit is provided in the drive circuit of a certain power module as shown in FIG. 3, or the configuration of FIG. 5 in which two reference voltage values Vref1 and Vref2 are adjustable.

As described above, according to the present embodiment, in addition to the effects of the first to third embodiments, it is possible to improve the efficiency when adjusting the reference voltage value. By the way, in a configuration in which a semiconductor device is implemented by storing a substrate where inverters are configured in a housing, switches of switching circuits and the knobs of the variable resistors (trimmers) for reference voltage value adjustment may be provided an end part of the substrate such that it is possible to manipulate them in the state where the substrate is mounted, or may be drawn out from the substrate such that it is possible to collectively adjust the reference voltage values of the plurality of power modules.

The present invention is not limited to the above-described embodiments, and it is possible to implement various modifications without departing the gist of the present invention. For example, the switches of the switching circuits 4 may be automatically switched according to commands from a computer, depending on modes such as an adjustment mode and an operation mode.

What is claimed is:

1. A semiconductor device comprising:
a plurality of power modules each of which includes
a power semiconductor switching element that has a temperature detection diode, and
a drive circuit that has an output circuit to switch the power semiconductor switching element on and off, and that is configured to output a warning signal if the value of the forward voltage of the temperature detection diode becomes equal to or smaller than a first reference voltage value, and that is configured to output a protection operation signal to stop the on/off operation of the power semiconductor switching element if the value of the forward voltage becomes equal to or smaller than a second reference voltage value smaller than the first reference voltage value,
the semiconductor device being configured to output a logical sum of the warning signals of the individual power modules as an external warning signal.

2. The semiconductor device according to claim 1, wherein the first reference voltage value for each power module is adjustable.

3. The semiconductor device according to claim 2, wherein each of the power modules has a switching unit to permit or prohibit output of the external warning signal.

4. The semiconductor device according to claim 1, wherein the second reference voltage value for each power module is adjustable.

5. The semiconductor device according to claim 1, wherein the drive circuit further includes:
a first comparator that is configured to compare the forward voltage and the first reference voltage, and that is configured to output the warning signal; and
a second comparator that is configured to compare the forward voltage and the second reference voltage, and is configured to output the protection operation signal, and
wherein the first comparator and the second comparator are hysteresis comparators.

6. The semiconductor device according to claim 1, wherein the semiconductor device is an inverter, and
wherein the power modules include a power module for an upper arm and a power module for a lower arm of the corresponding inverter, and the semiconductor device is configured to output the logical sum of the warning signal of the power module for the upper arm and the warning signal of the power module for the lower arm.

7. The semiconductor device according to claim 6, wherein the semiconductor device is a three-phase inverter including the power modules, and
wherein the semiconductor device is configured to output the logical sum of the warning signals of the power modules for individual phases forming the three-phase inverter.

* * * * *